United States Patent
Jang et al.

(10) Patent No.: US 7,187,084 B2
(45) Date of Patent: *Mar. 6, 2007

(54) DAMASCENE METHOD EMPLOYING COMPOSITE ETCH STOP LAYER

(75) Inventors: Syun-Ming Jang, Hsin-Chu (TW); Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 130 days.

This patent is subject to a terminal disclaimer.

(21) Appl. No.: 10/760,905

(22) Filed: Jan. 20, 2004

(65) Prior Publication Data

US 2004/0147100 A1    Jul. 29, 2004

Related U.S. Application Data

(63) Continuation of application No. 09/418,031, filed on Oct. 14, 1999, now Pat. No. 6,734,110.

(51) Int. Cl.
*H01L 23/48* (2006.01)
*H01L 23/52* (2006.01)
*H01L 29/40* (2006.01)

(52) U.S. Cl. .................. 257/774; 257/751; 257/758; 257/762

(58) Field of Classification Search ............ None
See application file for complete search history.

(56) References Cited

U.S. PATENT DOCUMENTS

| | | | |
|---|---|---|---|
| 5,380,679 A | 1/1995 | Kano | 437/192 |
| 5,451,543 A | 9/1995 | Woo et al. | 437/195 |
| 5,818,110 A | 10/1998 | Cronin | 257/775 |
| 6,069,069 A * | 5/2000 | Chooi et al. | 438/634 |
| 6,107,188 A * | 8/2000 | Liu et al. | 438/633 |
| 6,124,198 A * | 9/2000 | Moslehi | 438/622 |
| 6,136,682 A * | 10/2000 | Hegde et al. | 438/622 |
| 6,156,640 A * | 12/2000 | Tsai et al. | 438/636 |
| 6,174,810 B1 * | 1/2001 | Islam et al. | 438/687 |
| 6,255,233 B1 * | 7/2001 | Smith et al. | 438/786 |
| 6,326,301 B1 * | 12/2001 | Venkatesan et al. | 438/638 |
| 6,331,479 B1 * | 12/2001 | Li et al. | 438/618 |
| 6,424,021 B1 * | 7/2002 | Liu et al. | 257/649 |
| 6,436,819 B1 * | 8/2002 | Zhang et al. | 438/656 |
| 6,440,838 B1 * | 8/2002 | Lui et al. | 438/618 |
| 6,734,116 B2 * | 5/2004 | Guo et al. | 438/792 |
| 6,753,260 B1 * | 6/2004 | Li et al. | 438/700 |

* cited by examiner

*Primary Examiner*—Michael Lebentritt
*Assistant Examiner*—Angel Roman
(74) *Attorney, Agent, or Firm*—Haynes and Boone, LLP

(57) ABSTRACT

A damascene structure is provided comprising a substrate, a lower intermetal dielectric layer over the substrate, an exposed conductive structure within the lower intermetal dielectric layer, a composite etch stop layer over the lower intermetal dielectric layer and the exposed conductive structure; the composite etch stop layer comprising a first lower sub-layer and a second upper sub-layer, an upper intermetal dielectric layer over the composite etch stop layer, a trench interconnection opening forming within the upper intermetal dielectric layer and the composite etch stop layer, the trench interconnection opening exposing the conductive structure, a barrier metal layer at least lining the trench interconnection opening. and a conductor plug within the trench interconnection opening, contacting the conductive structure. The upper surface of the barrier metal layer is coplanar with the upper surface of the conductor plug.

11 Claims, 3 Drawing Sheets

DAMASCENE METHOD EMPLOYING COMPOSITE ETCH STOP LAYER

This is a continuation of patent application Ser. No. 09/418,031, filing date Oct. 14, 1999 now U.S. Pat. No. 6,734,110, Damascene Method Employing Composite Etch Stop Layer, assigned to the same assignee as the present invention.

BACKGROUND OF THE INVENTION

1. Field of the Invention

This invention relates to the field of conductor layers for interconnection within microelectronics fabrications. More specifically, the invention relates to the field of damascene methods for forming interconnection layers within microelectronics fabrications.

2. Description of the Related Art

Microelectronics fabrications employ conductor layers formed into patterned lines to interconnect the devices from which the fabrications are made. As the dimensions of microelectronics fabrications have become smaller, the density of interconnections has increased and the requirements placed upon interconnections have become more stringent. The number and complexity of interconnections dictate that multiple levels of interconnections be employed in practical microelectronics fabrications. There has developed a need for multi-level interconnection wiring for microelectronics fabrications with increasing demands and constraints placed on materials and methods.

In order to avoid increased electrical resistance as dimensions and hence conductor cross-sectional areas decrease, the art of microelectronics fabrication has resorted to conductor materials having higher electrical conductivity, such as, for example, copper. In addition, methods to reduce electrical resistance at contact areas between interconnection levels and via contacts have been pursued. Finally, fabrication methods and materials for forming multi-level interconnection layers which afford surface planarity as the number of interconnection levels increases have been developed, since the patterning of conductor layers by subtractive etching of conductor layers formed over surfaces leads to resulting raised surface profiles of the patterned conductor layer, which may cause subsequent fabrication problems and lead to reliability concerns.

Methods and materials providing high density interconnections with low electrical resistance have been developed which are generally satisfactory for meeting the requirements of microelectronics fabrications. These include forming the interconnection layer patterns from copper metal because of its intrinsically high electrical conductivity. The copper lines may be formed within depressions or trenches within a dielectric layer employing the method of "damascene" or inlaid pattern formation to provide a co-planar surface of the inlaid copper line pattern and the surrounding dielectric layer. Such trench patterns are often etched into an inter-level metal dielectric (IMD) layer employing photolithographic methods including an etch stop layer formed over the underlying via contact hole filled with a conductor material "stud" or "plug" to form a damascene stacked conductor interconnection layer. Such, damascene stacked conductor interconnection layers are not without problems, however.

For example, the use of copper metal as the via contact hole fill or stud to form an integral damascene stacked conductor layer is not feasible at the first level of contact, to the semiconductor device itself, since copper acts as a deleterious material in semiconductor devices with degrading effect on device operation. Thus it is necessary to employ a different metal such as tungsten for the via contact hole stud. In forming contact between the overlying copper layer and the tungsten stud, there are difficulties with conventional chemical mechanical polish (CMP) planarization of the tungsten stud and subsequent formation and etching of an IMD layer in which the copper lines are to be inlaid. This is particularly true if the planarization of the tungsten stud by harsh chemical exposure removes or damages the etch stop layer needed for the trench etching.

It is therefore towards the goal of forming improved multi-level conductor layers employing damascene methods and various conductor materials that the present invention is more generally directed.

Various methods have been disclosed for formation of damascene interconnection conductor layers with etch stop layers within semiconductor microelectronics fabrications.

For example, Kano, in U.S. Pat. No. 5,380,679, discloses a method for forming a multi-level conductor wiring structure in a microelectronics fabrication affording improved adhesion between layers with no additional photolithographic steps. The method employs an intermediate bonding conductor layer to improve adhesion between the component sub-layers which form the main part of the multilevel conductor structure. The conductor layers are formed by electroplating.

Further, Woo et al., in U.S. Pat. No. 5,451,543, disclose a method for forming vertical sidewalls when etching via contact holes through intermediate dielectric layers over conductor lines and lands. The method employs an etch stop layer which prevents resputtering which tends to form non-vertical sidewall profiles.

Finally, Cronin, in U.S. Pat. No. 5,818,110, discloses a method for forming multi-layer dual damascene interconnection layers without requiring interlock vias. The method employs etched via contact hole at locations such that wide and narrow openings are available. When refilled with a conformal deposited conductor layer of appropriate thickness, the narrow openings are completely gap filled, while the wide openings are only partially filled with central openings. Subsequent CMP planarization leaves the narrow holes filled with a conductor plug to the next conductor level, while the wide holes are non-conductor filled and not available for next-level interconnection.

Desirable in the art of microelectronics fabrication are additional methods for fabrication of improved multi-level conductor interconnection structures wherein there is formed a low resistance, high strength bond between the via hole contact conductor plug and the inlaid conductor wiring layer. Also desirable are damascene methods of formation whereby the underlying conductor plug and etch stop layer experiences limited damage during formation of the damascene structure.

It is towards these goals that the present invention is generally directed.

SUMMARY OF THE INVENTION

A first object of the present invention is to provide a method for forming a damascene multi-level conductor interconnection layer upon a substrate employed within a microelectronics fabrication with improved properties.

A second object of the present invention is to provide a method for forming a damascene multi-level conductor interconnection layer in accord with the first object of the present invention, where the conductor interconnection layer is formed of multi-level conductor materials for the underlying conductor stud portion and the overlying inlaid portion of the damascene conductor layer with attenuated degradation of the conductor layers due to processing conditions.

A third object of the present invention is to provide in accord with the first object of the present invention, and the second object of the present invention, a method which is readily commercially implemented.

In accord with the objects of the present invention, there is provided a method for fabrication within a substrate employed within a microelectronics fabrication a damascene interconnection method with inhibited/attenuated damage to a conductor stud layer accessed within a trench when forming the interconnection trench pattern within a dielectric layer overlying the stud layer. To practice the invention, there is first provided a substrate having a contact region formed therein employing a first intermediate metal dielectric (IMD) layer having a pattern of via contact holes etched through the IMD layer filled with studs of conductor material. There is then planarized the surface of the IMD contact region. There is then formed over the planarized first IMD layer contact region a blanket composite etch stop layer. There is then formed over the blanket composite etch stop layer a second inter-level metal dielectric (IMD). A photoresist mask of the interconnection layer trench pattern is then formed and employed to transfer the trench pattern by subtractive etching into the second IMD dielectric layer to the upper sub-layer of the composite etch stop layer by a first etching environment. The interconnection trench pattern is then transferred through the lower sub-layer of the composite etch stop layer by subtractive etching with a second etching environment, employing the first IMD as an etch mask. A barrier metal layer is formed over the substrate. The trench pattern is then filled with a second conductor material to complete the damascene multi-layer conductor interconnection layer, with improved properties and attenuated degradation effects due to processing on the multi-layer damascene conductor structure.

The substrate employed within the microelectronics fabrication of the present invention may be a substrate employed within an integrated circuit microelectronics fabrication, a charge coupled device microelectronics fabrication, a solar cell microelectronics fabrication, a light-emitting diode microelectronics fabrication, a ceramics substrate microelectronics fabrication or a flat panel display microelectronics fabrication, where the substrate may be formed from a microelectronics conductor material, a microelectronics semiconductor material or a microelectronics dielectric material.

The method of the present invention employs methods and materials which are known in the art of microelectronics fabrication, but in a novel order and sequence. Therefore the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 to FIG. 5 illustrate the formation within a substrate employed within a microelectronics fabrication a damascene multi-layer conductor interconnection layer with improved properties.

FIG. 6 to FIG. 10 illustrate the formation within a semiconductor substrate employed within a microelectronics fabrication a damascene multi-layer conductor interconnection layer employing various conductor materials with improved electrical properties and attenuated damage during processing.

DESCRIPTION OF THE PREFERRED EMBODIMENTS

The present invention provides a method for forming within a substrate employed within a microelectronics fabrication a damascene multi-layer conductor interconnection layer employing conductor materials with improved electrical properties and attenuated degradation from processing steps.

First Preferred Embodiment

Figure 1:
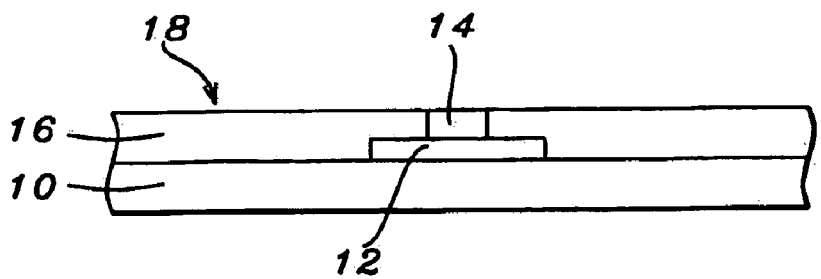
FIG. 1, FIG. 2, FIG. 3, FIG. 4 and FIG. 5 are directed towards a general embodiment of the present invention which constitutes a first preferred embodiment of the present invention.

Referring now to FIG. 1 to FIG. 5, there is shown a series of schematic cross-sectional diagrams illustrating various stages in the formation of a microelectronics fabrication in accord with a general embodiment of the present invention which constitutes a first preferred embodiment of the present invention. FIG. 1 is a schematic cross-sectional diagram of a microelectronics fabrication at an early stage in its fabrication in accord with a first embodiment of the present invention.

Shown in FIG. 1 is a substrate 10 upon which is formed a patterned conductor layer 12. Formed over the substrate is a first inter-level metal dielectric layer (IMD) 16 through which is formed a via contact hole filled with a conductor stud 14. The upper surface of the IMD dielectric layer 16 and the conductor via stud 14 are formed into a planarized top surface 18.

With respect to the substrate 10, the substrate 10 may be the substrate itself employed in the microelectronics fabrication, or alternatively the substrate may include any of several substrate layers employed as microelectronics substrate layers. The substrate or substrate layers may be formed of microelectronics conductor materials, microelectronics semiconductor materials or microelectronics dielectric materials. Preferably, the substrate 10 is a silicon semiconductor substrate.

With respect to the patterned conductor layer 12, the patterned conductor layer 12 may be formed of microelectronics conductor materials including but not limited to metals, alloys, conductive compounds, and semiconductors employing methods known in the art of microelectronics fabrication, including but not limited to thermal vacuum evaporation methods, electron beam evaporation methods, chemical vapor deposition (CVD) methods, physical vapor deposition (PVD) sputtering methods, electrodeposition (ED) methods, ion implantation (I/I) methods and diffusion methods. Preferably the patterned microelectronics conductor layer is formed of aluminum-copper alloy material employing physical vapor deposition (PVD) sputtering.

With respect to the conductor stud material 14, the conductor stud material 14 is preferably formed employing tungsten metal. The tungsten metal of the conductor stud 14 is preferably formed employing the method of chemical vapor deposition (CVD) from tungsten hexafluoride (WF$_6$); alternatively the tungsten metal may be formed employing physical vapor deposition (PVD) sputtering of tungsten metal.

With respect to the dielectric layer 16, the dielectric layer 16 is a silicon containing dielectric layer formed employing materials and methods known in the art of microelectronics fabrication. Preferably the silicon containing dielectric layer 16 is formed of silicon oxide employing chemical vapor deposition (CVD) in accord with the following process: (1) silane (SiH$_4$) source gas at a flow rate of about 90 standard cubic centimeters per minute(sccm); (2) nitrogen carrier gas at a flow rate of about 1000 standard cubic centimeters per minute (sccm); (3) substrate temperature about 400 degrees centigrade; (4) pressure about 5 Torr; (5) power about 600 watts; and (6) frequency 100 mHz.

With respect to the planarized surface 18, the planarized surface 18 is formed by chemical mechanical polish (CMP) planarization as is known in the art of microelectronics fabrication.

Figure 2:
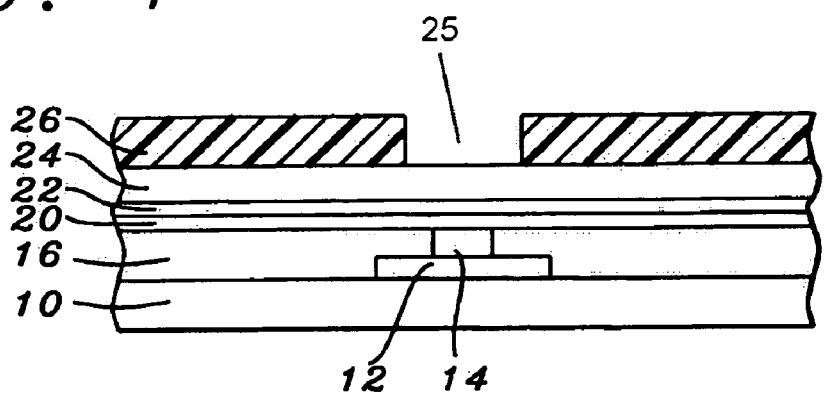

Referring now to FIG. 2, there is shown a schematic cross-sectional diagram illustrating the results of further processing of the microelectronics fabrication whose schematic cross-sectional diagram is shown in FIG. 1 in accord with the first preferred embodiment of the method of the present invention. Shown in FIG. 2 is a microelectronics fabrication otherwise equivalent to the microelectronics fabrication shown in FIG. 1, but where there has been formed over the substrate 10 a first lower sub-layer 20 and a second upper sub-layer 22 to provide a composite etch stop layer formed upon the planarized surface 18. Formed over the composite etch stop layer is a blanket second dielectric layer 24 and a patterned photoresist layer 26 defining a trench interconnection pattern 25 centered overlying the conductor stud pattern 14.

With respect to the lower sub-layer 20 of the composite etch stop layer shown in FIG. 2, the lower sub-layer 20 is formed employing a silicon oxide dielectric material employing plasma enhanced chemical vapor deposition (PECVD) method. Preferably the lower sub-layer 20 is formed according to the following process: (1) silane-nitrous oxide (SiH$_4$—N$_2$O) source gas flow rate of about 90–200 standard cubic centimeters per minute (sccm); (2) gas pressure about 5 Torr; (3) nitrogen carrier gas flow rate of about 1000 standard cubic centimeters per minute (sccm); (3) temperature about 400 degrees centigrade; (4) power about 600 watts; and (5) frequency 100 mHz.

With respect to the upper sub-layer 22 of the composite etch stop layer shown in FIG. 2, the upper sub-layer 22 is formed of silicon containing dielectric material employing, plasma enhanced chemical vapor deposition (PECVD). Preferably, the upper sub-layer 22 is formed of silicon oxynitride material employing the process conditions: (1) silane (SiH$_4$) silicon source gas at a flow rate of about 90 standard cubic centimeters per minute (sccm); (2) nitrogen/oxygen source nitrous oxide-ammonia (N$_2$O—NH$_3$) gases at a flow rate of about 90–90 standard cubic centimeters per minute (sccm); (3) pressure of about 5 Torr; (4) nitrogen carrier gas at a flow rate of about 2000 standard cubic centimeters per minute (sccm); (5) temperature about 400 degrees centigrade; (6) power about 600 watts; and (7) frequency 100 mHz.

With respect to the blanket second dielectric layer 24 shown in FIG. 2, the blanket second dielectric layer 24 is an inter-level metal dielectric (IMD) layer. Preferably, the second IMD layer is formed of silicon oxide dielectric material employing chemical vapor deposition (CVD) in accord with the following process: (1) silane (SiH$_4$) silicon source gas at a flow rate of about 100 standard cubic centimeters per minute (sccm); (2) nitrogen carrier gas at a flow rate of about 2000 standard cubic centimeters per minute, (sccm); (3) power about 600 watts; (4) frequency 100 mHz; (5) temperature about 400 degrees centigrade; and (6) pressure about 5 Torr. Alternatively, the second blanket IMD layer 22 may be a low dielectric constant dielectric layer formed from a low dielectric constant dielectric material as is known in the art of microelectronics fabrication.

With respect to the patterned photoresist etch mask pattern 26 defining the trench interconnection pattern 25, the patterned photoresist etch mask pattern 26 is formed employing photolithographic materials and methods as are well known in the art of microelectronics fabrication.

Figure 3:
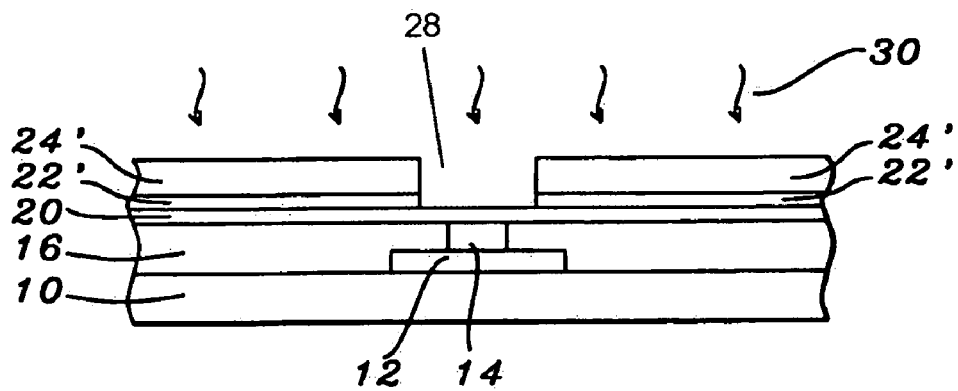

Referring now more particularly to FIG. 3, there is shown a schematic cross-sectional diagram illustrating the results of further processing, of the microelectronics fabrication whose schematic cross-sectional diagram is shown in FIG. 2 in accord with the first preferred embodiment of the present invention. Shown in FIG. 3 is a microelectronics fabrication otherwise equivalent to the microelectronics fabrication shown in. FIG. 2, but where there has been etched into and through the dielectric layer 24' and the upper second sub-layer 22' of the etch stop layer to the lower first sub-layer 20 of the etch stop layer a trench 28, employing a first subtractive etch environment 30, followed by final stripping of the photoresist etch mask pattern 26.

With respect to the first subtractive etch environment 30 shown in FIG. 3, the first subtractive etch environment 30 employs a mixture of tetrafluoromethane (CF$_4$), trifluoromethane (CHF$_3$) and oxygen as the etching gases.

Figure 4:
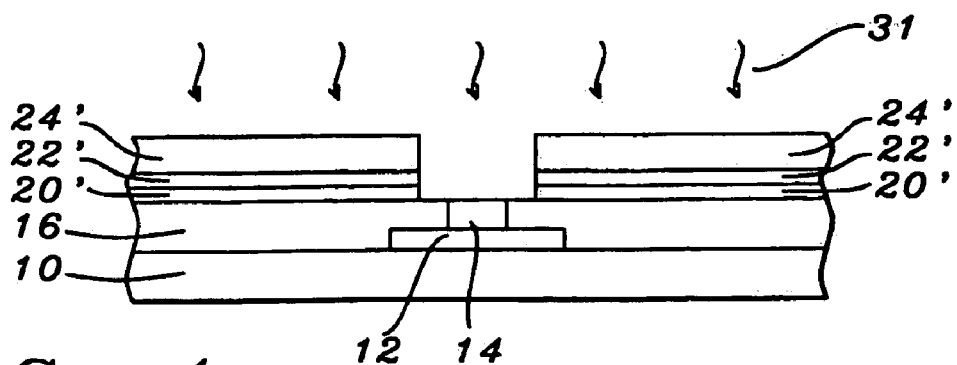

Referring now more particularly to FIG. 4, there is shown a schematic cross-sectional diagram illustrating the results of further processing of the microelectronics fabrication whose schematic cross-sectional diagram is shown in FIG. 3 in accord with the first preferred embodiment of the present invention. Shown in FIG. 4 is a microelectronics fabrication otherwise equivalent to the microelectronics fabrication shown in FIG. 3, but where there has been etched through the lower sub-layer 20' the pattern of the trench 28 employing a second subtractive etch environment 31.

With respect to the second subtractive etch environment 31 shown in FIG. 4, the second subtractive etch environment 31 is a sputter etching process employing argon as the sputtering gas.

Figure 5:
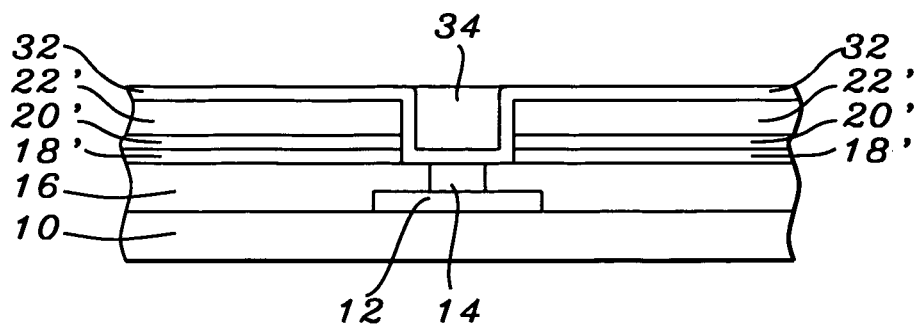

Referring now more particularly to FIG. 5, there is shown a schematic cross-sectional diagram illustrating the results of further processing, of the microelectronics fabrication whose schematic cross-sectional diagram is shown in FIG. 4 in accord with the first preferred embodiment of the present invention. Shown in FIG. 5 is a microelectronics fabrication otherwise equivalent to the microelectronics fabrication shown in FIG. 4, but where there is formed over the substrate a barrier metal layer 32. There is then formed within the trench a conductor material 34 to complete the dual damascene conductor layer.

With respect to the barrier metal layer 32 shown in FIG. 5, the barrier metal layer 32 is tantalum nitride (TaN) formed employing physical vapor deposition (PVD) sputtering.

With respect to the trench fill conductor material 34, the trench fill conductor material 34 may be a low resistivity conductor material selected from the group of conductor materials including but not limited to copper and aluminum. Preferably, the low resistivity conductor metal layer is formed employing the following process: (1) TaN barrier layer 300 angstroms in thickness formed employing physical vapor deposition (PVD) sputtering; (2) copper seed layer deposition 2000 angstroms in thickness formed employing physical vapor deposition (PVD) sputtering; (3) copper layer 8000 angstroms in thickness formed by electrochemical deposition (ECD).

Figure 6:
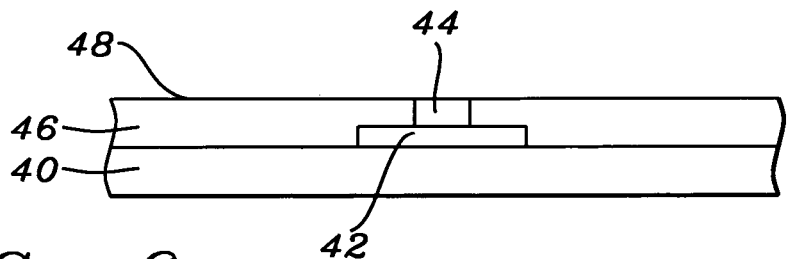
FIG. 6, FIG. 7, FIG. 8, FIG. 9 and FIG. 10 are directed towards a more specific embodiment of the present invention which constitutes a second preferred embodiment of the present invention.

The first preferred embodiment of the present invention provides a method for forming within a substrate employed within a microelectronics fabrication a damascene multi-layer conductor interconnection layer employing different conductor materials with improved electrical conductive and contact properties and attenuated degradation from chemical processing steps Second Preferred Embodiment Referring now to FIG. 6 to FIG. 10, there is shown a series of schematic cross-sectional drawings illustrating the results of forming in accord with a more specific embodiment of the present invention which constitutes a second preferred embodiment of the present invention a damascene multi-layer conductor interconnection layer employing various conductor materials with improved properties and attenuated degradation due to processing. FIG. 6 is a schematic cross-sectional diagram illustrating a microelectronics fabrication at an early stage in its fabrication in accord with the present invention.

Shown in FIG. 6 is a semiconductor substrate 40 upon which is formed a patterned conductor layer 42. Formed over the substrate is an inter-level metal dielectric (IMD) layer 46 through which is formed a via contact hole filled with a tungsten conductor stud 44. The upper surface of the dielectric layer 46 and the tungsten conductor stud 44 are formed into a planarized surface 48.

With respect to the semiconductor substrate 40 shown in FIG. 6, the semiconductor substrate 40 is analogous to the substrate 10 shown in FIG. 1 of the first preferred embodiment of the present invention. Preferably, the semiconductor substrate 40 is a silicon semiconductor substrate.

With respect to the patterned conductor layer 42 shown in FIG. 6, the patterned conductor layer 42 is analogous or equivalent to the patterned conductor layer 12 shown in FIG. 1 of the first preferred embodiment of the present invention.

With respect to the tungsten conductor stud layer 44, the tungsten conductor stud material 44 is formed employing chemical vapor deposition (CVD) of tungsten from tungsten hexafluoride ($WF_6$).

With respect to the chemical mechanical polish (CMP) planarized surface 48 shown in FIG. 6, the chemical mechanical polish (CMP) planarized surface 48 is analogous or equivalent to the chemical mechanical polish (CMP) planarized surface 18 shown in FIG. 1 of the first preferred embodiment of the present invention.

Figure 7:
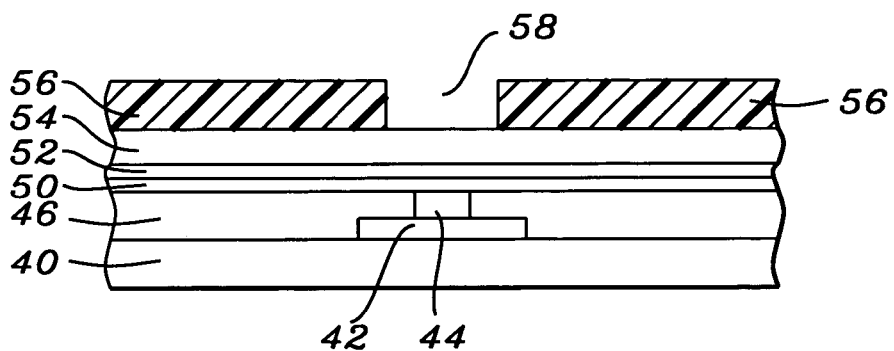

Referring now to FIG. 7, there is shown a schematic cross-sectional diagram illustrating the results of further processing of the microelectronics fabrication whose schematic cross-sectional diagram is shown in FIG. 6 in accord with the second preferred embodiment of the present invention. Shown in FIG. 7 is a microelectronics fabrication otherwise equivalent to the microelectronics fabrication shown in FIG. 6, but wherein there has been formed over the substrate a first lower sub-layer 50 and a second upper sub-layer 52 to form a composite etch stop layer. Formed over the composite etch stop layer is a blanket dielectric layer 54. Formed over the blanket dielectric layer 54 is a patterned photoresist etch mask layer 56 providing a trench interconnection pattern 58 centered over the underlying conductor stud pattern 44.

With respect to the first lower sub-layer 50 of the composite etch stop layer shown in FIG. 7, the first lower sub-layer 50 is formed employing an organic polymer low dielectric constant spin-on-polymer (SOP) dielectric material. Preferably, the organic polymer low dielectric constant spin-on-polymer (SOP) dielectric material is a fluorinated poly (arylene ether) organic polymer commercially available as FLARE from Allied Signal Corporation, 1349 Moffett Park Drive, Sunnyvale, Calif. 94089 USA, or alternately as PAE-2 from Schumacher Corporation, 1969 Palomar Oaks Way, Carlsbad, Calif. 92009 USA. A further alternative commercial fluorinated poly(arylene ether) organic polymer low dielectric constant spin-on-polymer (SOP) dielectric material is SILK, available from Dow Chemical Co., 1712 Building, Midland, Mich. 48674 USA.

With respect to the second upper sub-layer 52 of the composite etch stop layer shown in FIG. 7, the second upper sub-layer 52 is formed of a silicon containing dielectric material formed employing chemical vapor deposition. Preferably the silicon containing dielectric layer is a silicon oxynitride dielectric layer analogous or equivalent to the silicon oxynitride layer 22 shown in FIG. 2 of the first preferred embodiment of the present invention.

With respect to the blanket dielectric layer 54 shown in FIG. 7, the blanket dielectric layer 54 is an inter-level metal dielectric (IMD) layer. Preferably, the blanket dielectric layer 54 is analogous or equivalent to the blanket dielectric IMD layer 24 shown in FIG. 2 of the first preferred embodiment of the present invention.

With respect to the patterned photoresist etch mask layer 56 shown in FIG. 7, the patterned photoresist etch mask layer 56 is analogous or equivalent to the patterned photoresist etch mask layer 26 shown in FIG. 2 of the first preferred embodiment of the present invention.

Figure 8:
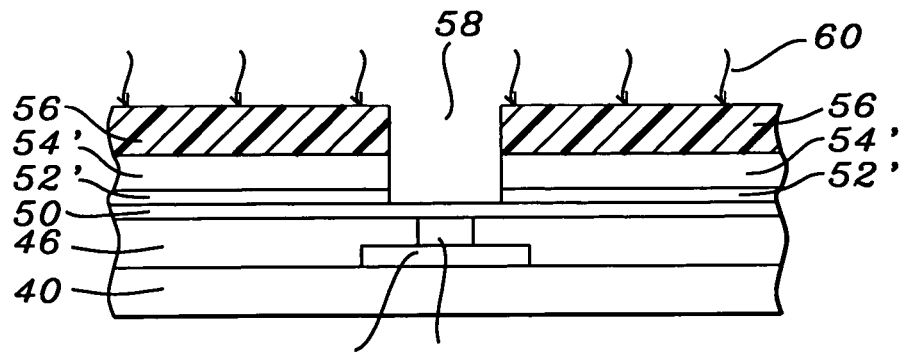

Referring now to FIG. 8, there is shown a schematic cross-sectional diagram illustrating the results of further processing of the microelectronics fabrication whose schematic cross-sectional diagram is shown in FIG. 7. Shown in FIG. 8 is a microelectronics fabrication otherwise equivalent to the microelectronics fabrication shown in FIG. 7, but where there has been etched in a subtractive etching environment 60 the interconnection trench pattern 58 through the photoresist etch mask layer 56, the blanket dielectric layer 54' and the second upper sub-layer 52' to the lower first sub-layer 50 of the composite etch stop layer.

With respect to the subtractive etching environment 60 shown, in FIG. 8, the subtractive etch environment 60 is analogous or equivalent to the first subtractive etch environment shown in FIG. 3 of the first preferred embodiment of the present invention.

Figure 9:
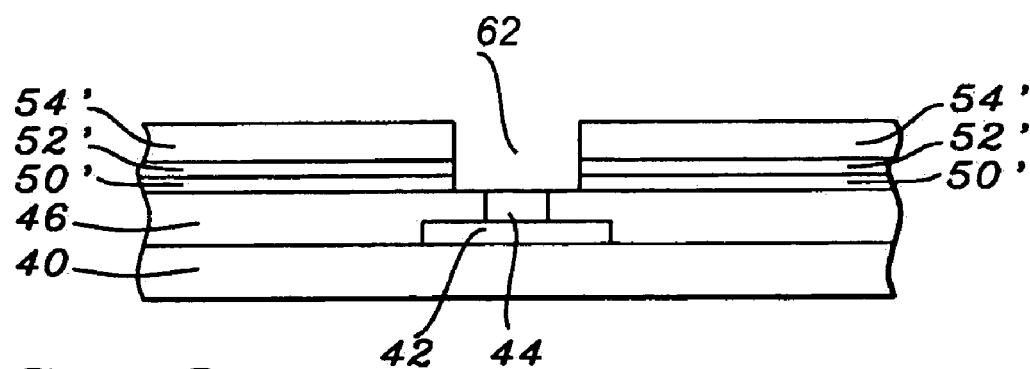

Referring now to FIG. 9, there is shown a schematic cross-sectional diagram illustrating the results of further processing of the microelectronics fabrication whose schematic cross-sectional diagram is shown in FIG. 8 in accord with the second-preferred embodiment of the present invention. Shown in FIG. 9 is a microelectronics fabrication otherwise equivalent to the microelectronics fabrication shown in FIG. 8, but where there has been etched through the lower sub-layer 50' of the composite etch stop layer the interconnection trench pattern 58 while simultaneously stripping the photoresist etch mask layer 56 in the etching/stripping environment 62.

With respect to the stripping/etching environment 62 shown in FIG. 9, the stripping/etching environment 62 employs the following process conditions: (1) oxygen gas at a pressure of about 10 Torr; (2) temperature of about 200 degrees centigrade; and (3) power of about 500 watts.

Figure 10:
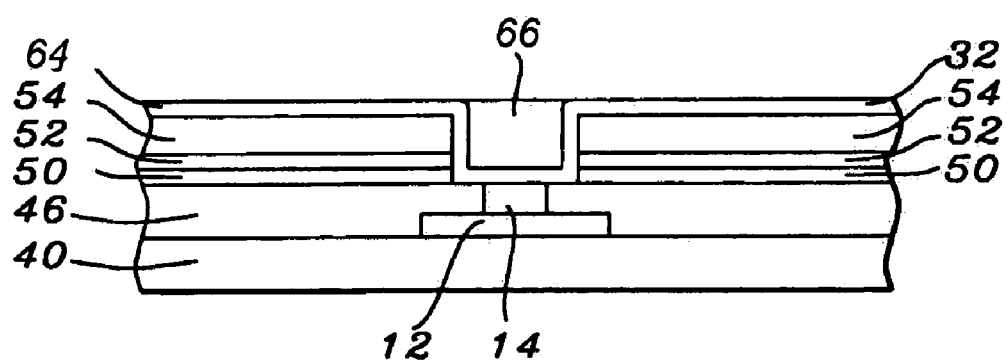

Referring now to FIG. 10, there is shown a schematic cross-sectional diagram illustrating the results of final processing of the microelectronics fabrication whose schematic cross-sectional diagram is shown in FIG. 9 in accord with the second preferred embodiment of the present invention. Shown in FIG. 10 is a microelectronics otherwise equivalent to the microelectronics fabrication shown in FIG. 9, but where there has been formed over the substrate a blanket barrier metal layer 64. Formed within the interconnection trench pattern 58 is a copper conductor layer 66 to complete the damascene interconnection conductor layer.

With respect to the barrier metal layer 64 and the copper conductor metal 66, the barrier metal layer 64 and copper conductor layer 66 are analogous or equivalent to the barrier metal layer 32 and the copper conductor layer 34 shown in FIG. 5 of the first preferred embodiment of the present invention.

The second preferred embodiment of the present invention provides a method for forming within a semiconductor substrate employed within an integrated circuit microelectronics fabrication a damascene multi-layer conductor interconnection scheme with attenuated damage to the tungsten conductor stud layer due to processing of the overlying patterned inlaid copper layer within the dielectric layers, and with improved electrical conductivity and contacts.

As is understood by a person skilled in the art, the preferred embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A damascene structure, comprising:
   a substrate;
   a lower intermetal dielectric layer over the substrate;
   an exposed conductive structure within the lower intermetal dielectric layer;
   a composite etch stop layer over the lower intermetal dielectric layer and the exposed conductive structure; the composite etch stop layer comprising a first lower sub-layer and a second upper sub-layer; the first lower sub-layer is an organic spin-on-polymer; and the second upper sub-layer is a silicon-containing dielectric layer;
   an upper intermetal dielectric layer over the composite etch stop layer;
   a trench interconnection opening forming within the upper intermetal dielectric layer and the composite etch stop layer: the trench interconnection opening, exposing the conductive structure;
   a barrier metal layer at least lining the trench interconnection opening; and
   a conductor plug within the trench interconnection opening, contacting the conductive structure, wherein an upper surface of the barrier metal layer is coplanar with an upper surface of the conductor plug.

2. The structure of claim 1, wherein the silicon-containing dielectric layer is a plasma enhanced chemical vapor deposition (PECVD) silicon-containing dielectric layer.

3. The structure of claim 1, wherein the organic spin-on polymer is a fluorinated poly (arylene ether) organic polymer; and the silicon-containing dielectric layer is a silicon oxynitride dielectric layer.

4. The structure of claim 1, wherein organic spin-on polymer is a fluorinated poly (arylene ether) organic polymer, and the silicon-containing dielectric layer is a silicon oxynitride dielectric layer.

5. The structure of claim 1, wherein the substrate is semiconductor substrate; the conductive structure is comprised of a metal; the upper intermetal dielectric layer is silicon oxide; and the conductive plug is aluminum or copper.

6. The structure of claim 1, wherein the barrier metal layer comprising TaN.

7. The structure of claim 1, wherein the barrier metal layer comprising PVD TaN.

8. The structure of claim 1, wherein the conductive plug includes a metal seed layer.

9. The structure of claim 1, wherein the conductive plug comprises a copper seed layer and an overlying copper metal.

10. The structure claim 1, wherein the conductive structure comprises a lower patterned conductor layer and an upper conductor stud.

11. The structure of claim 1, wherein the conductive structure comprises a lower patterned conductor layer and an upper tungsten stud; the lower patterned conductor layer comprising metal, alloys, conductive compounds or semiconductors.

* * * * *